US010444293B2

(12) United States Patent
Kozuka et al.

(10) Patent No.: US 10,444,293 B2
(45) Date of Patent: Oct. 15, 2019

(54) BATTERY VOLTAGE MEASUREMENT CIRCUIT

(71) Applicant: PRIMEARTH EV ENERGY CO., LTD., Kosai-shi, Shizuoka (JP)

(72) Inventors: Yusuke Kozuka, Toyohashi (JP); Mitsuhiro Kamo, Hamamatsu (JP)

(73) Assignee: PRIMEARTH EV ENERGY CO., LTD., Kosai-Shi (JP)

( * ) Notice: Subject to any disclaimer, the term of this patent is extended or adjusted under 35 U.S.C. 154(b) by 171 days.

(21) Appl. No.: 15/521,273

(22) PCT Filed: Mar. 11, 2015

(86) PCT No.: PCT/JP2015/057205
§ 371 (c)(1),
(2) Date: Apr. 21, 2017

(87) PCT Pub. No.: WO2016/103742
PCT Pub. Date: Jun. 30, 2016

(65) Prior Publication Data
US 2017/0299658 A1    Oct. 19, 2017

(30) Foreign Application Priority Data

Dec. 24, 2014  (JP) .................................. 2014-260123

(51) Int. Cl.
*G01R 31/3835*  (2019.01)
*G01R 31/02*   (2006.01)
(Continued)

(52) U.S. Cl.
CPC ....... *G01R 31/3835* (2019.01); *G01R 31/025* (2013.01); *G01R 31/396* (2019.01);
(Continued)

(58) Field of Classification Search
CPC .............. G01R 31/3835; G01R 31/396; G01R 31/025; H01M 10/482; H02J 7/0021; H02J 7/0026
See application file for complete search history.

(56) References Cited

U.S. PATENT DOCUMENTS

2006/0261677 A1* 11/2006 Shibuya ................ H02J 7/0018
                                                        307/105
2010/0134068 A1*  6/2010 Lim ...................... H02J 7/0016
                                                        320/116
(Continued)

FOREIGN PATENT DOCUMENTS

JP        2011-027629 A    2/2011
JP        2012-137422 A    7/2012
(Continued)

OTHER PUBLICATIONS

International Preliminary Report on Patentability for corresponding PCT Application No. PCT/JP2015/057205, dated Dec. 20, 2016.

*Primary Examiner* — Jermele M Hollington
*Assistant Examiner* — Feba Pothen
(74) *Attorney, Agent, or Firm* — Maschoff Brennan

(57) ABSTRACT

A battery voltage measurement circuit measures voltages at a plurality of rechargeable batteries. The rechargeable batteries are connected to a flying capacitor via input-side semiconductor switches. The capacitor is connected to inverting input terminals of first and second differential amplification circuits. Output terminals of the differential amplification circuits are directly or indirectly connected to a calculation unit that calculates voltages at the rechargeable batteries. The output terminal and the inverting input terminal of each differential amplification circuit are connected via a corresponding sub-capacitor. Each differential amplification circuit includes a non-inverting input terminal connected to a reference potential. The negative electrode of the rechargeable battery is connected to the reference potential via a leakage detection circuit.

8 Claims, 3 Drawing Sheets

(51) Int. Cl.
*H01M 10/48* (2006.01)
*G01R 31/396* (2019.01)
*H02J 7/00* (2006.01)

(52) U.S. Cl.
CPC ......... *H01M 10/482* (2013.01); *H02J 7/0021* (2013.01); *H02J 7/0026* (2013.01)

(56) References Cited

U.S. PATENT DOCUMENTS

| | | |
|---|---|---|
| 2013/0285667 A1 | 10/2013 | Koduka et al. |
| 2014/0197841 A1 | 7/2014 | Mizoguchi |
| 2015/0054519 A1* | 2/2015 | Tomonaga ............ G01R 31/396 324/434 |

FOREIGN PATENT DOCUMENTS

| | | |
|---|---|---|
| JP | 2014-021023 A | 2/2014 |
| JP | 2014-137272 A | 7/2014 |

* cited by examiner

BATTERY VOLTAGE MEASUREMENT CIRCUIT

TECHNICAL FIELD

The present invention relates to a battery voltage measurement circuit that measures battery voltage.

BACKGROUND ART

Conventionally, charging and discharging of a rechargeable battery is adjusted to be performed within an appropriate range that is set based on the state of charge (SOC), which is an index indicating the charged state of the battery, to avoid excessive charging and discharging, which would deteriorate the battery performance. It is desirable that the SOC be calculated with high accuracy so that charging and discharging is performed within the appropriate SOC range. Patent document 1 describes a technique for measuring the voltage at a rechargeable battery, which is used for SOC calculation, with high accuracy.

Patent document 1 describes a battery voltage measurement circuit that includes a main capacitor, which is connected to two terminals of a rechargeable battery via an input-side semiconductor switch and charged by the rechargeable battery, and a differential amplification circuit, which is connected to the main capacitor via an output-side semiconductor switch. A sub-capacitor connects an output terminal and an inverting input terminal of the differential amplification circuit.

PRIOR ART DOCUMENT

Patent Document

Patent Document 1: Japanese Laid-Open Patent Publication No. 2012-137422

SUMMARY OF THE INVENTION

The battery voltage measurement circuit of patent document 1 uses the main capacitor as a flying capacitor to accurately measure the voltage at a rechargeable battery.

The flying capacitor is usually connected to a rechargeable battery, which is subject to voltage measurement, and a measurement circuit by switching a switch on and off. If a mechanical contact switch were to be used to open and close an electric path from the two terminals of the flying capacitor to the rechargeable battery or the measurement circuit, current will not flow when the switch is open and charging will not occur. Thus, unnecessary charging of the flying capacitor will not occur, and voltage measurement may immediately be started with the flying capacitor.

However, such a battery voltage measurement circuit now uses a semiconductor switch to reduce the circuit size and increase the speed. The semiconductor switch, which is compact and fast, practically keeps the electric path open but does not open a mechanical contact. Thus, the occurrence of leak current, however small it may be, is inevitable. When current flows, regardless of whether the current is small like leak current, the current will cause unnecessary charging of the flying capacitor. In such a case, the voltage may not be accurately measured. Further, the flying capacitor may have to be discharged before measurement.

It is an object of the present invention to provide a battery voltage measurement circuit that accurately and quickly measures voltage with a flying capacitor even when a semiconductor switch opens and closes an electric path to the flying capacitor.

A battery voltage measurement circuit according to one aspect of the present invention includes a main capacitor, a first differential amplification circuit, a second differential amplification circuit, a calculation unit, a first sub-capacitor, and a second sub-capacitor. The main capacitor is connected in parallel to a plurality of rechargeable batteries via input-side semiconductor switches connected to the rechargeable batteries. The first differential amplification circuit includes an inverting input terminal connected to a first terminal of the main capacitor via a first output-side semiconductor switch. The second differential amplification circuit includes an inverting input terminal connected to a second terminal of the main capacitor via a second output-side semiconductor switch. The calculation unit is directly or indirectly connected to the first and second differential amplification circuits. The calculation unit calculates a voltage at the rechargeable battery based on a voltage between an output terminal of the first differential amplification circuit and an output terminal of the second differential amplification circuit. The first sub-capacitor is connected to the output terminal and the inverting input terminal of the first differential amplification circuit. The second sub-capacitor is connected to the output terminal and the inverting input terminal of the second differential amplification circuit. The first and second differential amplification circuits each include a non-inverting terminal connected to a reference potential, and one electrode of one of the rechargeable batteries is connected to the reference potential via an external circuit.

The semiconductor switch practically interrupts the circuit when deactivated but cannot prevent the flow of a small current such as leak current. Thus, even if the semiconductor switch interrupts the electric path to the capacitor, the capacitor will be charged in an unnecessary manner as time elapses however small the current may be. This will cause, for example, the problem that voltage cannot be immediately measured using the capacitor. In this regard, in the above configuration, the two terminals of the main capacitor are connected to the reference potential via the output-side semiconductor switches and the differential amplification circuits or via the input-side semiconductor switches and the external circuit. Thus, even when leak current flows through the input-side semiconductor switches or the output-side semiconductor switches, an electric path loop including the reference potential, the external detection circuit, the input-side semiconductor switches, the output-side semiconductor switches, the differential amplification circuits, and the reference potential is formed. That is, the main capacitor is not included in the electric path loop. Accordingly, when the semiconductor switch is off, even if a small current flows and time elapses, the main capacitor is not charged by the current. Thus, even if the voltages are measured in long intervals and the deactivation time of the semiconductor switch is long, the main capacitor is not charged in an unnecessary manner. This allows voltage measurement with the main capacitor to be resumed more quickly and with higher accuracy.

In a preferred example, the external circuit is a leakage detection circuit connected between a negative electrode of the one of the rechargeable batteries and the reference potential.

This configuration allows for detection of leakage from the rechargeable batteries.

In a preferred example, the main capacitor includes a plurality of capacitors that are connected in series.

This configuration allows the capacitors to have a lower withstanding voltage.

A preferred example further includes a series circuit that includes a resistor and a semiconductor switch that are connected in parallel to each of the sub-capacitors.

This configuration allows the integration circuit to be selectively operated for the first and second differential amplification circuits.

A preferred example further includes a third differential amplification circuit located between the output terminals of the first and second differential amplification circuits and the calculation unit. The third differential amplification circuit includes an inverting input terminal connected to the output terminal of the first differential amplification circuit. The third differential amplification circuit includes a non-inverting input terminal connected to the output terminal of the second differential amplification circuit. The third differential amplification circuit includes an output terminal connected to the calculation unit.

In this configuration, the difference between the output terminals of the first and second differential amplification circuit is obtained by the third differential amplification circuit. This eliminates the need for the calculation unit to calculate the difference and simplifies the calculation process. Further, even if common mode noise enters the outputs of the first and second differential amplification circuits, the common mode noise is removed when the third differential amplification circuit calculates the difference between the two outputs.

The battery voltage measurement circuit according to the aspect of the present invention accurately and quickly measures voltage with a flying capacitor even when a semiconductor switch opens and closes an electric path to the flying capacitor.

Other aspects and advantages of the present invention will become apparent from the following description, taken in conjunction with the accompanying drawings, illustrating by way of example the principles of the invention.

EMBODIMENTS OF THE INVENTION

A first embodiment of a battery voltage measurement circuit will now be described with reference to FIG. 1. The battery voltage measurement circuit includes a flying capacitor voltage detection circuit and measures battery voltages at rechargeable batteries. Each rechargeable battery may be a single battery or a battery module in which a group of single batteries are connected in series. In the illustrated example, the rechargeable batteries are battery modules B1 to B14 that are connected in series to form an assembled battery. The assembled battery is installed in, for example, a vehicle such as an electric vehicle or a hybrid vehicle. Each rechargeable battery is a nickel-metal hydride rechargeable battery.

Figure 1:
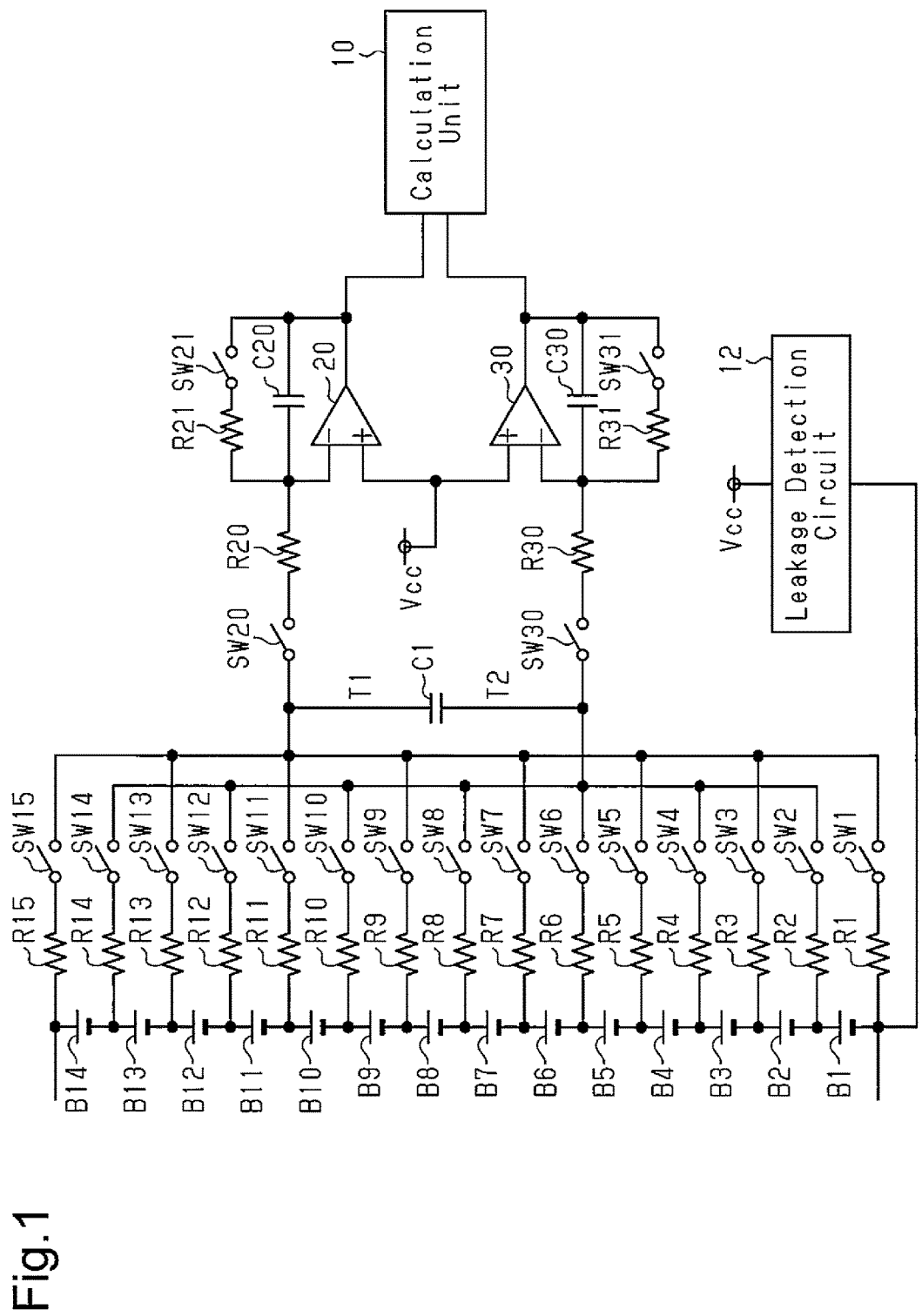
FIG. 1 is a circuit diagram showing a first embodiment of a battery voltage measurement circuit.

As shown in FIG. 1, a negative electrode of the assembled battery is a negative terminal of the battery module B1, and a positive electrode of the assembled battery is a positive terminal of the battery module B14. The battery modules B1 to B14 are connected to a voltage detection circuit via input-side semiconductor switches SW1 to SW15. More specifically, a resistor R1 and the input-side semiconductor switch SW1 are connected in series to the negative terminal of the battery module B1, and a resistor R2 and the input-side semiconductor switch SW2 are connected in series to a positive terminal of the battery module B1 and a negative terminal of the battery module B2. Further, a resistor R3 and the input-side semiconductor switch SW3 are connected in series to a positive terminal of the battery module B2 and a negative terminal of the battery module B3. In the same manner, resistors Rm (m=n+1) and input-side semiconductor switches SWm are connected in series to positive terminals of battery modules Bn (n=integer from 3 to 12) and negative terminals of battery modules Bm. A resistor R14 and the input-side semiconductor switch SW14 are connected in series to a positive terminal of the battery module B13 and a negative terminal of the battery module B14, and a resistor R15 and the input-side semiconductor switch SW15 are connected in series to a positive terminal of the battery module B14.

Each of the resistors R1 to R15 functions as a current limiting resistor that limits energizing current.

Among the input-side semiconductor switches SW1 to SW15, the input-side semiconductor switches SW2, SW4, SW6, SW8, SW10, SW12, and SW14 are connected to one terminal T1 of a flying capacitor C1. Further, the input-side semiconductor switches SW1, SW3, SW5, SW7, SW9, SW11, and SW13 are connected to the other terminal T2 of the flying capacitor C1.

The flying capacitor C1 is a capacitor that maintains voltages at the battery modules B1 to B14 that are subject to measurement. A known capacitor (condenser) is used as the flying capacitor C1. The flying capacitor C1 has the withstanding voltage and capacitance that are required for measurement.

The terminal T1 of the flying capacitor C1 is connected to an inverting input terminal of a first differential amplification circuit 20 via an output-side semiconductor switch SW20 and a resistor R20. The other terminal T2 of the flying capacitor C1 is connected to an inverting input terminal of a second differential amplification circuit 30 via an output-side semiconductor switch SW30 and a resistor R30.

The first and second differential amplification circuits 20 and 30 are known operational amplifiers that can form differential amplification circuits or integration circuits.

A non-inverting input terminal of the first differential amplification circuit 20 and a non-inverting input terminal (+) of the second differential amplification circuit 30 are connected to a reference potential Vcc. The reference potential Vcc may be the potential at a first reference potential terminal (or reference potential source) that differs from the flying capacitor C1. Further, a sub-capacitor C20 is connected between the inverting input terminal (−) and an output terminal of the first differential amplification circuit 20 to form an integration circuit, and a sub-capacitor C30 is connected between the inverting input terminal and an output terminal of the second differential amplification circuit 30 to form an integration circuit. A series circuit including a resistor R21 and a switch SW21 is connected in parallel to the sub-capacitor C20, and a series circuit including a resistor R31 and a switch SW31 is connected in parallel to the sub-capacitor C30. Thus, the integration circuits are configured to be selectively operable by switching the switches SW21 and SW31 on and off so that the integration circuits are functional when the switches SW21 and SW31 are off and the integration circuits are non-functional when the switches SW21 and SW31 are on. It is preferred that the two resistors R20 and R30 have the same resistance, the two sub-capacitors C20 and C30 have the same capacitance, and the two resistors R21 and R31 have the same resistance since the first and second differential amplification circuits 20 and 30 have the same characteristics. In addition, the first and second differential amplification circuits 20 and 30 may have different resistances and different capacitances when necessary.

The outputs of the first and second differential amplification circuits 20 and 30 are connected to a calculation unit 10 including an analog-to-digital converter (A/D). The calculation unit 10 is hardware including one or more operation circuits such as an electronic control unit (ECU) and has a known calculation function to perform calculations in accordance with predetermined programs.

Each of the input-side semiconductor switches SW1 to SW15 and each of the output-side semiconductor switches SW20 and SW30 include a semiconductor switch such as an analog switch, a multiplexer, and a solid-state relay. Such a semiconductor switch practically switches an electric path on and off. When the electric path goes off, the semiconductor switch does not completely insulate the electric path and interrupts the electric path with high resistance. In other words, the electric path is in connection with high resistance. Thus, even when the semiconductor switch is off, the flow of a small current such as leak current is inevitable. When the semiconductor switch is used in a circuit including a capacitor, the small current that flows when the semiconductor switch is off may charge the capacitor in an unnecessary manner as time elapses. Accordingly, such a circuit configuration that charges the capacitor in an unnecessary manner may hinder accurate voltage measurement or cause the need to discharge the capacitor prior to voltage measurement. In this regard, the present embodiment includes a circuit configured to reduce unnecessary charging of the capacitor even when a long time elapses.

The operation of the battery voltage measurement circuit will now be described.

In this configuration, voltages at the battery modules B1 to B14 are sequentially detected. More specifically, when detecting the voltage at the voltage module B1, the two input-side semiconductor switches SW1 and SW2 connected to the negative electrode and the positive electrode of the battery module B1 are on, and the other input-side semiconductor switches SW3 to SW15 are off. This charges the flying capacitor C1 with the voltage at the battery module B1 and holds the voltage at the battery module B1. After the flying capacitor C1 is charged, the two input-side semiconductor switches SW1 and SW2 are deactivated and the two output-side semiconductor switches SW20 and SW30 are then activated so that the flying capacitor C1 is connected to each of the differential amplification circuits 20 and 30. As a result, the voltage at the battery module B1 is detected in a state in which the differential amplification circuits 20 and 30 are electrically interrupted from the high-voltage assembled battery. More specifically, when the voltage at the terminal T1 of the flying capacitor C1 is applied to the inverting input terminal of the first differential amplification circuit 20 and the reference potential Vcc is applied to the non-inverting input terminal of the first differential amplification circuit 20, the voltage difference between the reference potential Vcc and the voltage at the terminal T1 of the flying capacitor C1 is detected as the voltage at the terminal T1. When the voltage at the other terminal T2 of the flying capacitor C1 is applied to the inverting input terminal of the second differential amplification circuit 30 and the reference potential Vcc is applied to the non-inverting input terminal of the second differential amplification circuit 30, the voltage difference between the reference potential Vcc and the voltage at the other terminal T2 of the flying capacitor C1 is detected as the voltage at the other terminal T2.

The voltage at the terminal T1 detected by the first differential amplification circuit 20 and the voltage at the other terminal T2 detected by the second differential amplification circuit 30 are input to the calculation unit 10 (ECU). The voltage at the terminal T1 output by the first differential amplification circuit 20 and the voltage at the other terminal T2 output by the second differential amplification circuit 30 are relative values from the reference voltage Vcc. Thus, when the differences between the values are calculated, the value of the reference voltage Vcc is cancelled. This accurately obtains the voltage between the two terminals T1 and T2 of the flying capacitor C1. In such a manner, the calculation unit 10 receives the voltage at the flying capacitor C1, that is, signals that allow the voltage at the battery module B1 to be calculated. The calculation unit 10 calculates the voltage from the difference between two input signals and thus performs the process quickly and easily.

For each of the other battery modules B2 to B14, the input-side semiconductor switches connected to the corresponding negative terminal and the corresponding positive terminal are activated to charge the flying capacitor C1, and then the input-side semiconductor switches are deactivated to hold the voltage at the flying capacitor C1. Subsequently, the voltage at the charged flying capacitor C1 is detected as described above.

A known controller (not shown) such as an ECU instructs the timing for switching on and off the input-side semiconductor switches SW1 to SW15 and the output-side semiconductor switches SW20 and SW30 and the timing for having the calculation unit 10 calculate the voltage.

In addition to the flying capacitor voltage detection circuit, a leakage detection circuit 12 that detects current leakage from the assembled battery is connected to the assembled battery. The leakage detection circuit 12 is connected to the negative terminal of the battery module B1, which serves as the negative electrode of the assembled battery, and the reference potential Vcc. The reference potential Vcc connected to the leakage detection circuit 12 may correspond to the potential at a second reference potential terminal (or reference potential source). The first and second reference potential terminals (reference potential sources) may be the same terminal or different terminals as long as the reference potential Vcc at the first and second reference potential terminals is the same. The leakage detection circuit 12 includes a transmitter (not shown) that transmits a frequency signal and a receiver (not shown) that receives a frequency signal. When leakage does not occur, the receiver receives a frequency signal having a constant strength. When leakage of one kind or another occurs, the received strength changes. Thus, leakage may be detected by detecting a change in the strength. A known circuit may be used as the leakage detection circuit, such as a circuit that transmits the frequency signal or a circuit that detects leakage from the potential difference.

Further, the leakage detection circuit 12 is configured to detect leakage by monitoring the assembled battery and the reference potential Vcc. Thus, the leakage detection circuit 12 electrically connects the assembled battery and the reference potential Vcc regardless of whether or not the resistance is high. This causes the leakage detection circuit 12 to form a path through which current, however small it may be, flows between the assembled battery and the reference voltage Vcc.

A prior art circuit includes a flying capacitor configured by two series-connected capacitors and connects a connection point of the capacitors to the reference potential Vcc via a semiconductor switch. In this circuit, the first differential amplification circuit 20 detects the voltage difference between the two terminals of one of the capacitors, and the second differential amplification circuit 30 detects the voltage difference between the two terminals of the other capacitor. In such a circuit, as long as the semiconductor switch is off, the terminal corresponding to the connection point of the two capacitors are disconnected from the reference potential. However, as described above, a small amount of current flows through the semiconductor switch even when the semiconductor switch is off. Thus, the reference potential Vcc is supplied to the terminal corresponding to the connection point of the capacitors via the semiconductor switch. Accordingly, the small current flows in correspondence with the potential difference between the reference potential Vcc and the potentials at the terminals of the capacitors connected to the assembled battery. This charges each capacitor as time elapses. In particular, when an external circuit, which may be the leakage detection circuit 12, is arranged between the assembled battery and the reference potential Vcc, an electric path loop is formed, with the capacitor arranged between the assembled battery and the reference potential Vcc. This will further increase the probability of the capacitors being charged even when the semiconductor switch is off. If the capacitors are charged, when using the capacitors to measure the voltage, the voltage may not be accurately charged. Further, the capacitors may have to be discharged. This will delay the voltage measurement.

In the present embodiment, the two terminals of the flying capacitor C1 are connected to the reference potential Vcc via the output-side semiconductor switches SW20 and SW30, the resistors R20 and R30, and the differential amplification circuits 20 and 30. Further, the two terminals of the flying capacitor C1 are connected to the reference potential Vcc via the input-side semiconductor switch SW1 and the leakage detection circuit 12 or via each of the input-side semiconductor switches SW2 to SW15, each of the battery modules B1 to B14, and the leakage detection circuit 12. Thus, an electric path loop through which a small current flows is formed by the reference potential Vcc, the leakage detection circuit 12, in some cases, at least one of the battery modules B1 to B14, at least one of the input-side semiconductor switches SW1 to SW15, at least one of the output-side semiconductor switches SW20 and SW30, at least one of the differential amplification circuits 20 and 30, and the reference potential Vcc. Such an electric path loop does not include the flying capacitor C1. Thus, when a semiconductor switch is off, the charging of the flying capacitor C1 with the small current is prevented or limited even if time elapses. Accordingly, even when battery voltages are measured in long intervals and the deactivation time of the semiconductor switch is long, unnecessary charging of the flying capacitor C1 does not occur. This allows voltage measurement to be quickly resumed. Further, at each of the terminals T1 and T2 of the flying capacitor C1, the circuit configuration is the same from the terminals T1 and T2 to the reference potential Vcc. Thus, each of the terminals T1 and T2 is less likely to be charged when a potential difference occurs between the two terminals T1 and T2 of the flying capacitor C1. Furthermore, from the terminals T1 and T2 of the flying capacitor C1, the resistors R1 to R15, R20, and R30, the differential amplification circuits 20 and 30, and the leakage detection circuit 12 in addition to the semiconductor switch are arranged in the paths to the reference potential Vcc. Thus, in the flying capacitor C1, as compared to when one of the terminals of the flying capacitor C1 is connected to the reference voltage Vcc only via the semiconductor switch, the potential difference is less likely to be large between the terminals T1 and T2 and the assembled battery. This also reduces the probability of the flying capacitor C1 being charged with a small current.

The input-side semiconductor switches SW1 to SW15 connect the terminal T1 of the flying capacitor C1 to the portion from the potential at the negative electrode of the battery module B1 to the potential at the positive electrode of the battery module B14 and connect the other terminal T2 of the flying capacitor C1 to the portion from the potential at the positive electrode of the battery module B1 to the potential at the negative electrode of the battery module B14. Thus, when the input-side semiconductor switches SW1 to SW15 are off, the two terminals T1 and T2 of the flying capacitor C1 have substantially the same potential even if a small current flows. Accordingly, when the input-side semiconductor switches SW1 to SW15 are off, the rechargeable battery is less likely to charge the flying capacitor V1 as long as the battery modules B1 to B14 output the same voltage.

The SOC is accurately calculated based on the voltage accurately detected by the calculation unit 10 of the present embodiment. This allows a battery controller that controls charging and discharging of the assembled battery to charge and discharge the assembled battery in a further preferred manner.

As described above, the battery voltage measurement circuit of the present embodiment has the following advantages.

(1) The semiconductor switch practically interrupts the circuit when deactivated but cannot prevent the flow of a small current such as leak current. Thus, even if the semiconductor switch interrupts the electric path to the capacitor, the capacitor will be charged in an unnecessary manner as time elapses however small the current may be. This will cause, for example, the problem that voltage cannot be immediately measured using the capacitor. In this regard, in the present embodiment, the two terminals T1 and T2 of the flying capacitor C1 are connected to the reference potential Vcc via the output-side semiconductor switches SW20 and SW30 and the differential amplification circuits 20 and 30 or via the input-side semiconductor switches SW1 to SW15 and the leakage detection circuit 12. Thus, even when leak current flows through the input-side semiconductor switches SW1 to SW15 or the output-side semiconductor switches SW20 and SW30, an electric path loop is formed by the reference potential Vcc, the leakage detection circuit 12, the input-side semiconductor switches SW1 to SW15, the output-side semiconductor switches SW20 and SW30, the differential amplification circuits 20 and 30, and the reference potential Vcc. That is, the flying capacitor C1 is not included in the electric path loop. Accordingly, when the semiconductor switch is off, even if a small current flows and time elapses, the flying capacitor C1 is not charged by the current. Thus, even if the voltages are measured in long intervals and the deactivation time of the semiconductor switch is long, the flying capacitor C1 is not charged in an unnecessary manner. This allows voltage measurement with the flying capacitor C1 to be resumed more quickly and with higher accuracy.

(2) The leakage detection circuit is connected between the negative electrode of the assembled battery (battery module B1) and the reference potential Vcc to detect leakage from the assembled battery (battery module B1).

(3) The sub-capacitors C20 and C30 are connected in parallel to the series circuits including the resistors R20 and R30 and the output-side semiconductor switches SW20 and SW30. This allows the integration circuits to be selectively operated for the first and second differential amplification circuits 20 and 30.

(4) Since the voltage at the nickel-metal hydride rechargeable battery is measured with high accuracy, the calculation accuracy of an SOC increases. As a result, charging and discharging of the rechargeable battery is adjusted in a further preferred manner.

A second embodiment of a battery voltage measurement circuit will now be described with reference to FIG. 2. The second embodiment is the same as the first embodiment except in that the outputs of the first and second differential amplification circuits 20 and 30 are input to a third differential amplification circuit. Thus, the following description focuses on the configuration that differs from the first embodiment. Like or same reference numerals are given to those components that are the same as the corresponding components of the first embodiment. Such components will not be described in detail.

Figure 2:
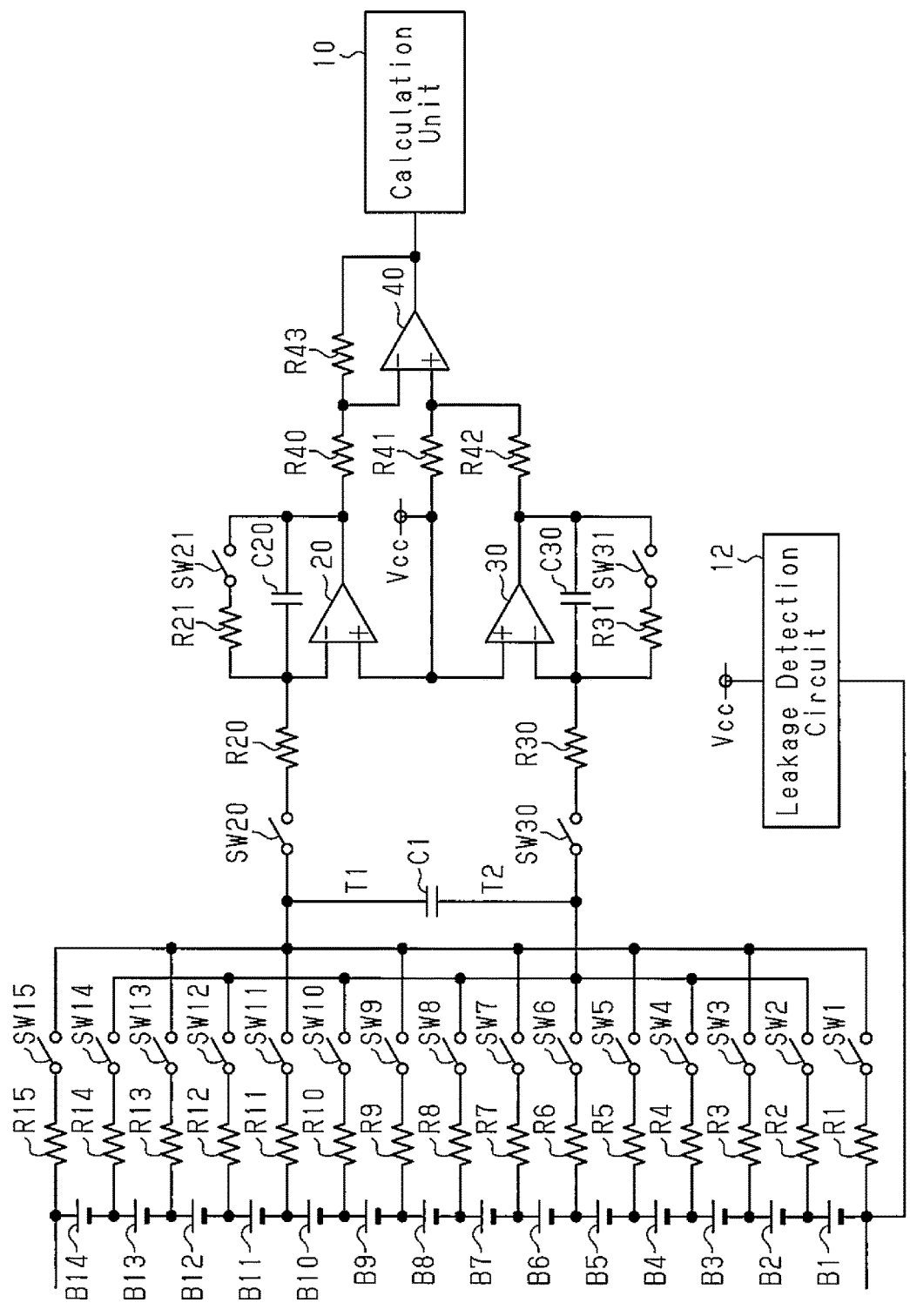
FIG. 2 is a circuit diagram showing a second embodiment of a battery voltage measurement circuit.

As shown in FIG. 2, a third differential amplification circuit 40 is arranged between the first and second differential amplification circuits 20 and 30 and the calculation unit 10. The output terminal of the first differential amplification circuit 20 is connected to an inverting input terminal of the third differential amplification circuit 40 via a resistor R40. Further, the output terminal of the second differential amplification circuit 30 is connected to a non-inverting input terminal of the third differential amplification circuit 40 via a resistor R42, and the third differential amplification circuit 40 is connected to the reference potential Vcc via a resistor R41. A resistor R43 is arranged between an output terminal and the inverting input terminal of the third differential amplification circuit 40 to form a differential amplification circuit that amplifies the potential difference of the input voltage.

The operation of the third differential amplification circuit 40 will now be described.

For example, when common mode noise exists in the voltage that is measured, the common mode noise enters the output of the first and second differential amplification circuits 20 and 30. However, when the third differential amplification circuit 40 calculates the difference of two signals, the common mode noise is removed. The third differential amplification circuit 40 outputs its calculation result to the calculation unit 10. Further, the calculation unit 10 receives the voltage between the two terminals T1 and T2 of the flying capacitor C1. This eliminates the need for receiving signals indicating the voltages at the two terminals T1 and T2 to calculate the difference between the two signals. Thus, the process of the calculation unit 10 is further simplified. This simplifies the program used by the calculation unit 10 for calculations and performs processing more quickly.

This configuration allows for accurate detection of voltage at the flying capacitor C1, that is, voltages at the battery modules B1 to B14.

As described above, the battery voltage measurement circuit of the present embodiment has the following advantage in addition to advantages (1) to (4) described in the first embodiment.

(5) The difference between the output terminals of the first and second differential amplification circuits 20 and 30 is obtained by the third differential amplification circuit 40. This eliminates the need for the calculation unit 10 to calculate the difference and simplifies the calculation process. Further, even if common mode noise enters the outputs of the first and second differential amplification circuits 20 and 30, the common mode noise is removed when the third differential amplification circuit 40 calculates the difference between the two signals.

The embodiments may be modified as follows.

In the embodiments, the external circuit is a leakage detection circuit. Instead, the external circuit may be, for example, a detection circuit, a control circuit, or a communication circuit as long as the circuit is located between the assembled battery and the reference potential.

In the embodiments, the battery modules B1 to B14 are connected in series. Instead, the voltages at battery modules that are connected in parallel may be measured simultaneously or separately.

In the embodiments, the voltage at each of the battery modules B1 to B14 is measured. Instead, the voltages at a plurality of battery modules that are connected in series or the voltage at the assembled battery may be measured. This shortens the measurement time. Further, when narrowing down anomalies, the voltages at the battery modules in the narrowed range may be separately measured.

In the embodiments, the number of the battery modules B1 to B14 is fourteen. Instead, there may be less than or more than fourteen battery modules.

In the embodiments, the first and second differential amplification circuits are selectively operated as integration circuits. Instead, the first and second differential amplification circuits may always be operated as integration circuits.

Figure 3:
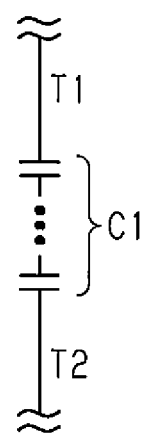
FIG. 3 is a circuit diagram showing a modified example of a battery voltage measurement circuit.

In the embodiments, the flying capacitor is a single capacitor. Instead, the flying capacitor may include a plurality of capacitors that are connected in series as shown in FIG. 3. The use of a plurality of capacitors allows each capacitor to have a lower withstanding voltage.

Further, in the conventional battery voltage measurement circuit including a circuit that connects the connection point of two series-connected capacitors to the reference potential, the configuration of the present embodiment is easily applicable when an electric path of the connection point and the reference potential is mechanically interrupted.

In the embodiments, the battery modules B1 to B14 are nickel-metal hydride rechargeable batteries. Instead, the battery may be an alkaline rechargeable battery, such as a lithium-ion rechargeable battery or a nickel-cadmium rechargeable battery, or any other type of rechargeable battery.

In the embodiments, the rechargeable batteries are the battery modules B1 to B14. Instead, the rechargeable battery may be, for example, a single battery, a battery block, or an assembled battery.

In the embodiments, a vehicle in which a rechargeable battery is installed is, for example, an electric vehicle or a hybrid vehicle. Instead, the vehicle may be a gasoline vehicle or a diesel vehicle in which a battery is installed. Further, when needed as a power supply, the rechargeable battery may be used for a movable body other than a vehicle or be used as a stationary power supply or as a power supply for something other than a motor. Instead of powering a vehicle, the rechargeable battery may be used to power, for example, a movable body, such as a train, a ship, an aircraft, or a robot, or an electrical appliance such as an information processor.

The present invention is to be considered as illustrative and not restrictive. The subject matter of the present invention may be included in fewer features than all of the disclosed features of the specific embodiments. The scope of the present invention and equivalence of the present invention are to be understood with reference to the appended claims.

DESCRIPTION OF REFERENCE CHARACTERS

10 . . . Calculation unit, 12 . . . Leakage detection circuit, 20 . . . First differential amplification circuit, 30 . . . Second differential amplification circuit, 40 . . . Third differential amplification circuit, B1-B14 . . . Battery modules, C1 . . . Flying capacitor, C20, C30 . . . Sub-capacitors, R1-R15, R20, R21, R30, R31, R40-R43 . . . Resistors, SW1-SW15 . . . input-side semiconductor switches, SW20, SW30 . . . Output-side semiconductor switches, SW21, SW31 . . . Switches, T1, T2 . . . Terminals, Vcc . . . Reference potential

The invention claimed is:

1. A battery voltage measurement circuit comprising:
a main capacitor connected in parallel to a plurality of rechargeable batteries via input-side semiconductor switches connected to the rechargeable batteries;
a first differential amplification circuit including an inverting input terminal connected to a first terminal of the main capacitor via a first output-side semiconductor switch;
a second differential amplification circuit including an inverting input terminal connected to a second terminal of the main capacitor via a second output-side semiconductor switch;
a calculation unit that is directly or indirectly connected to the first and second differential amplification circuits, wherein the calculation unit calculates a voltage at a first one of the plurality of rechargeable batteries based on a voltage between an output terminal of the first differential amplification circuit and an output terminal of the second differential amplification circuit;
a first sub-capacitor connected to the output terminal and the inverting input terminal of the first differential amplification circuit; and
a second sub-capacitor connected to the output terminal and the inverting input terminal of the second differential amplification circuit, wherein:
the first and second differential amplification circuits each include a non-inverting terminal connected to a reference potential, and one electrode of one of the rechargeable batteries, which is the first one of the plurality of rechargeable batteries or a second one of the plurality of rechargeable batteries, is connected to the reference potential via an external circuit, and whenever the main capacitor is electrically connected to the reference potential the main capacitor is electrically connected to the reference potential via at least one of the first differential amplification circuit, the second differential amplification circuit, and the external circuit.

2. The battery voltage measurement circuit according to claim 1, wherein the external circuit is a leakage detection circuit connected between a negative electrode of the one of the rechargeable batteries, which is the first one of the plurality of rechargeable batteries or the second one of the plurality of rechargeable batteries, and the reference potential.

3. The battery voltage measurement circuit according to claim 1, wherein the main capacitor includes a plurality of capacitors that are connected in series.

4. The battery voltage measurement circuit according to claim 1, further comprising a series circuit that includes a resistor and a semiconductor switch that are connected in parallel to each of the sub-capacitors.

5. The battery voltage measurement circuit according to claim 1, further comprising a third differential amplification circuit located between the output terminals of the first and second differential amplification circuits and the calculation unit, wherein:
the third differential amplification circuit includes an inverting input terminal connected to the output terminal of the first differential amplification circuit,
the third differential amplification circuit includes a non-inverting input terminal connected to the output terminal of the second differential amplification circuit, and
the third differential amplification circuit includes an output terminal connected to the calculation unit.

6. The battery voltage measurement circuit according to claim 1, wherein the reference potential applied to the non-inverting input terminals of the first and second differential amplification circuits is the same as the reference potential applied to the external circuit.

7. The battery voltage measurement circuit according to claim 1, wherein the non-inverting input terminals of the first and second differential amplification circuits are directly connected to a reference potential terminal that has the reference potential and differs from the main capacitor.

8. The battery voltage measurement circuit according to claim 7, wherein the non-inverting input terminals of the first differential amplification circuit and the second differential amplification circuit are commonly connected to the reference potential terminal.

* * * * *